United States Patent [19]
Goto et al.

[11] Patent Number: 5,254,951
[45] Date of Patent: Oct. 19, 1993

[54] CIRCUIT FOR MEASURING DISCHARGING AND CHARGING CURRENT OF A BATTERY PROVIDING OFFSET/DRIFT VOLTAGE FOR CORRECTING AMPLIFIER OUTPUT

[75] Inventors: Seiji Goto; Kazuaki Tsunoda, both of Fukuòka; Yukio Murayama, Kawasaki, all of Japan

[73] Assignee: Fujitsu Limited, Kawasaki, Japan

[21] Appl. No.: 888,785

[22] Filed: May 27, 1992

[30] Foreign Application Priority Data

May 29, 1991 [JP] Japan .................. 3-152138

[51] Int. Cl.$^5$ ............ G01R 31/36; G01N 27/42; H02J 7/04
[52] U.S. Cl. ................. 324/426; 320/48; 324/433; 324/429; 340/636
[58] Field of Search ........... 324/426, 429, 433, 434; 340/636; 320/48

[56] References Cited
U.S. PATENT DOCUMENTS 4,823,086  4/1989  Whitmire et al. .......... 324/433 X

FOREIGN PATENT DOCUMENTS 62-254080  11/1987  Japan .

*Primary Examiner*—Gerard R. Strecker
*Assistant Examiner*—Diep Do
*Attorney, Agent, or Firm*—Staas & Halsey

[57] ABSTRACT

A current measuring circuit for measuring discharging current and charging current of a battery, which is selectively connected to a load and a charger. The current measuring circuit comprises a resistor connected in series with the battery having a sufficiently low resistance value as not to substantially restrain the output current from the battery and a differential amplifier for amplifying a potential difference between both ends of the resistor. By providing a switch for short-circuiting one input terminal and the other input terminal of the differential amplifier, an offset/drift voltage of the differential amplifier can be obtained. This offset/drift voltage is used for correcting the output voltage from the differential amplifier at the time of current measurement and, thereby, the discharging current and charging current of the battery can be measured accurately.

14 Claims, 12 Drawing Sheets

CIRCUIT FOR MEASURING DISCHARGING AND CHARGING CURRENT OF A BATTERY PROVIDING OFFSET/DRIFT VOLTAGE FOR CORRECTING AMPLIFIER OUTPUT

BACKGROUND OF THE INVENTION

1. Field of the Invention

The present invention relates to a current measuring circuit for measuring discharging current and charging current of a battery, which is selectively connected to a load such as an electronic apparatus or the like and a battery charger.

2. Description of the Related Art

Mobile terminals such as portable telephone sets are generally driven by a battery. Therefore, it is desirable to constantly measure the charged condition of the battery and to charge the battery when the residual capacity of the battery decreases. In a battery such as a nickel-cadmium battery, the voltage does not decrease significantly but the discharging current decreases remarkably when the residual capacity decreases. Accordingly, residual capacity meters adapted to detect the discharging current of a battery to thereby measure the residual capacity of the battery have been in wide use. For example, a discharging current measuring circuit of the prior art is disclosed for example in Japanese Laid-open Patent Publication No. 59-145485. In this reference, a resistor is connected to the positive terminal of a battery and a voltage is directly measured across the resistor through an A/D converter. With such a current measuring circuit, the current value I can be obtained by substituting the potential difference V across the resistor having the resistance value R in Ohm's law I=V/R.

In the prior art current measuring circuit, the discharging current of the battery is restrained by the inserted resistor, and therefore, there have been problems with such prior art current measuring circuits. These prior art current measuring circuits are not suitable for measuring the discharging current of a battery supplying a large current and are unable to measure a wide range of currents.

There is also known such a type of current measuring circuit, which is adapted such that the potential difference across a resistor for current detection is amplified by a differential amplifier before being output to an A/D converter. However, in correctly measuring the discharging current of a battery, an operational amplifier of an expensive low offset/low drift voltage type must be used in the differential amplifier. Hence, there has been a problem with this type in that the current measuring circuit incurs an increase in cost.

SUMMARY OF THE INVENTION

Accordingly, an object of the present invention is to provide a current measuring circuit capable of measuring battery discharging current and charging current over a wide range from a small current to a large current.

Another object of the present invention is to provide a current measuring circuit capable of correctly measuring the battery discharging current and charging current with an economical structure, which does not require the use of expensive parts.

In accordance with an aspect of the present invention, there is provided a current measuring circuit for measuring discharging current and charging current of a battery comprising a first battery, which is selectively connected to a load and a charger; a resistor connected in series with the first battery and having a sufficiently low resistance value as not to substantially restrain the output current from the first battery; and a first differential amplifier for amplifying a potential difference across the resistor, the first differential amplifier comprising a first operational amplifier, a first resistor connected between one end of the resistor and one input terminal of the first operational amplifier, a second resistor connected between the one input terminal and the output terminal of the first operational amplifier, a third resistor connected between the other end of the resistor and the other input terminal of the first operational amplifier, and a fourth resistor connected between the other input terminal of the first operational amplifier and ground, wherein the resistance value of the first resistor is set equal to the resistance value of the third resistor and the resistance value of the second resistor is set equal to the resistance value of the fourth resistor.

Preferably, the current measuring circuit is provided with a short-circuiting means for short-circuiting the one input terminal and the other input terminal of the first operational amplifier, so that the output voltage of the first operational amplifier in such short-circuited state, i.e., the offset/drift voltage of the operational amplifier, is obtained. By using this offset/drift voltage for correcting the output voltage from the first operational amplifier at the time of current measurement, it becomes possible to attain accurate measurement of the discharging current and charging current of the battery without using an expensive operational amplifier of a low offset/low drift type.

Preferably, the current measuring circuit is provided with a fifth resistor connected in parallel with the second resistor, a first switch connected in series with the fifth resistor and in parallel with the second resistor, a sixth resistor connected in parallel with the fourth resistor, and a second switch connected in series with the sixth resistor and in parallel with the fourth resistor. Then, by closing the first and second switches, the gain of the first operational amplifier can be decreased and, hence, the amplification factor of the first differential amplifier can be made smaller. By switching the gains of the operational amplifier as described above, it becomes possible to achieve measurement of a wide range of currents from a small current to a large current.

The above and other objects, features and advantages of the present invention and the manner of realizing them will become more apparent, and the invention itself will best be understood from a study of the following description and appended claims with reference to the attached drawings showing some preferred embodiments of the invention.

DESCRIPTION OF THE PREFERRED EMBODIMENTS

Embodiments of the present invention will be described below in detail with reference to the accompanying drawings.

Figure 1:
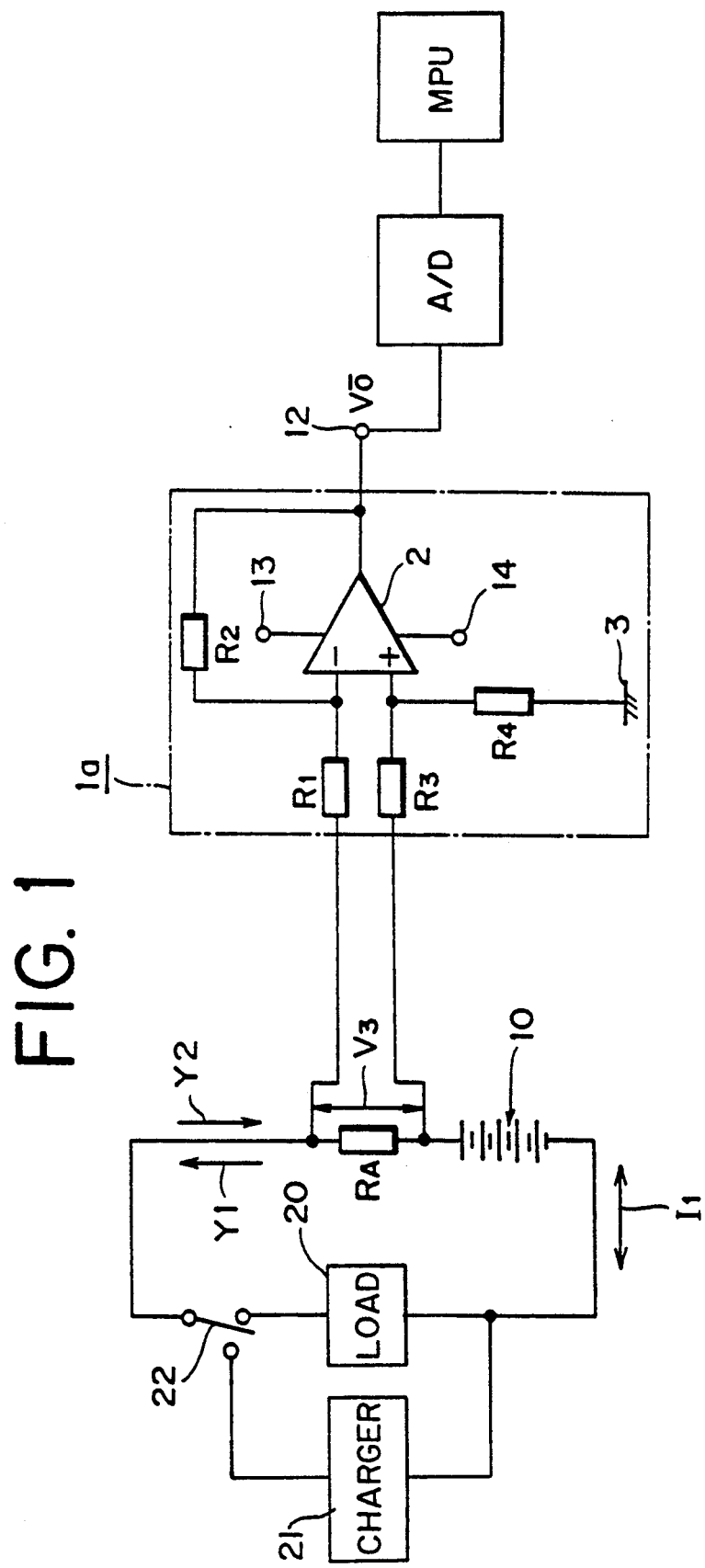
FIG. 1 is a circuit diagram of a current measuring circuit for measuring battery discharging/charging current according to a first embodiment of the present invention.

Referring first to FIG. 1, a current measuring circuit of a first embodiment of the present invention will be described. Reference numeral 10 denotes a rechargeable battery such as a nickel-cadmium battery. By connecting a switch 22 to the side of a load 20 such as a portable telephone set, the load 20 comes to be driven by the battery 10. When the switch 22 is connected to the side of a battery charger 21, the battery 10 is charged.

On the positive electrode side of the battery 10, there is connected a resistor $R_A$ in series with the battery. The resistor $R_A$ has a sufficiently low resistance value as not to virtually restrain the output current from the battery. Preferably, the resistance value of the resistor $R_A$ is set below 0.1Ω.

When the switch 22 is connected to the side of the load 20 and the load is driven by the battery 10, a current $I_1$ flows in the direction of the arrow Y1 (discharging direction). On the other hand, when the switch 22 is connected to the side of the charger 21, the current $I_1$ flows in the direction of the arrow Y2 (charging direction) and the battery 10 is thereby charged. As the current $I_1$ flowing out of the battery 10 or flowing into the battery 10 flows through the resistor $R_A$, there is generated a very small potential difference $V_3$ across the resistor $R_A$ and this potential difference $V_3$ is applied to both inputs of a differential amplifier 1a.

The differential amplifier 1a comprises an operational amplifier 2. A first resistor $R_1$ is connected between one input terminal (the inverting input terminal '−' in FIG. 1) of the operational amplifier 2 and one end of the resistor $R_A$. A second resistor $R_2$ is connected between the inverting input terminal '−' and the output terminal of the operational amplifier 2. A third resistor $R_3$ is connected between the other input terminal (the noninverting input terminal '+' in FIG. 1) of the operational amplifier 2 and the other end of the resistor $R_A$. A fourth resistor $R_4$ is connected between the noninverting input terminal '+' of the operational amplifier 2 and ground 3.

When the resistance values of the first to fourth resistors $R_1$ to $R_4$ are set to $R_1 = R_3$ and $R_2 = R_4$ in the arrangement of the differential amplifier 1a as described above, the gain of the operational amplifier 2 equals $R_2/R_1$ and this becomes the amplification factor of the differential amplifier 1a. Accordingly, by setting the resistance values of the resistors $R_1$ to $R_4$ at will under the conditions of $R_1 = R_3$ and $R_2 = R_4$, the amplification factor of the differential amplifier 1a can be set as desired.

The differential amplifier 1a amplifies the voltage $V_3$ applied thereto by the amplification factor $R_2/R_1$ and outputs the amplified voltage from its output terminal 12 as a voltage $V_0$. The output voltage $V_0$ becomes a positive or a negative voltage depending on the direction of the current with respect to the battery 10. The voltage $V_0$ becomes positive when the current flows out of the battery 10 in the discharging direction (in the direction of the arrow Y1) and becomes negative when the current flows in the charging direction (in the direction of the arrow Y2).

Thus, by measuring the voltage $V_0$ with a measuring apparatus, the discharging current or charging current of the battery 10 can be measured. However, since the output voltage $V_0$ becomes positive or negative, it is required to apply a bias voltage to the A/D converter circuit in the measuring apparatus for determining the positive or negative polarity of the voltage $V_0$.

In the case of the circuit configuration shown in FIG. 1, operating power-supply voltages are applied to the positive power-supply terminal 13 and the negative power-supply terminal 14 of the operational amplifier 2. As the positive power-supply voltage, a positive voltage higher than the sum of the voltage of the battery 10 and the voltage of the potential difference $V_3$ is required, and as the negative power-supply voltage, a negative voltage lower than $-V_3$ is required. Accordingly, the positive power-supply terminal 13 is connected with a positive power supply, not shown, to supply such a positive voltage and the negative power-supply terminal 14 is connected with a negative power supply, not shown, to supply such a negative voltage.

When the load 20 such as a portable telephone set or the like is driven by the battery 10, the current $I_1$ flows in the direction of the arrow Y1 and thereby a very small potential difference $V_3$ is produced across the resistor $R_A$. The very small potential difference $V_3$ is multiplied in the differential amplifier 1a by the amplification factor $R_2/R_1$ and output from the output terminal 12 as the voltage $V_0$. Then, the discharging current $I_1$ of the battery 10 can be measured by measuring the output voltage $V_0$. As the battery 10 is used up, the discharging current $I_1$ decreases, and therefore, by observing the discharging current, the timing for charging the battery 10 can be determined. When the battery 10 is used up, the switch 22 is connected to the side of the charger 21 and the battery 10 is charged. When the battery 10 is sufficiently charged, the charging current $I_1$ decreases and, hence, the output voltage $V_0$ of the differential amplifier 1a lowers. Therefore, the timing at which the battery 10 is fully charged can be determined by observing the output voltage $V_0$.

Figure 2:
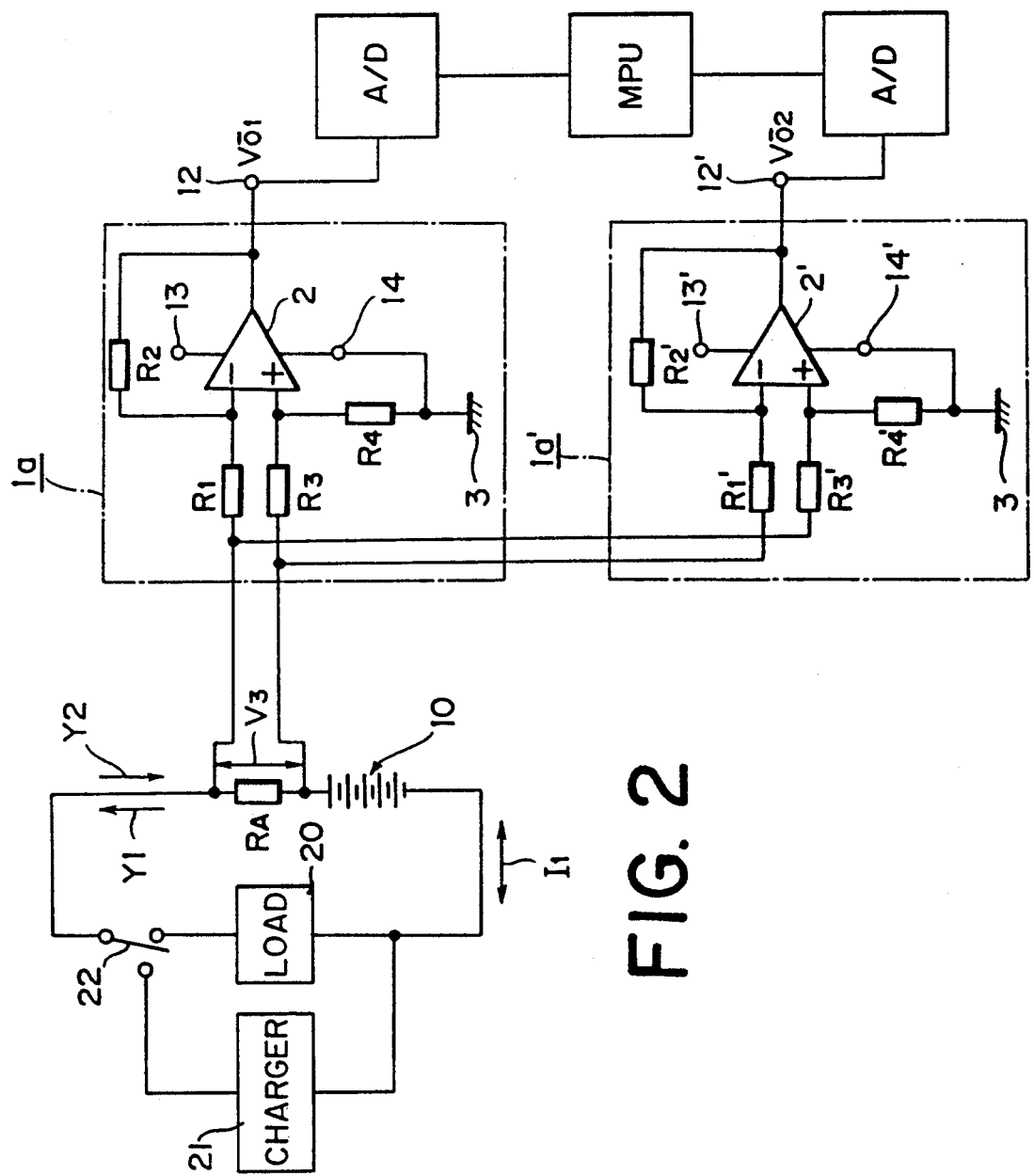
FIG. 2 is a circuit diagram of a current measuring circuit for measuring battery discharging/charging current according to a second embodiment of the present invention.

Referring to FIG. 2, there is shown a current measuring circuit of a second embodiment of the present invention. The current measuring circuit in this embodiment is composed of two sets of the differential amplifiers 1a shown in FIG. 1. In order to distinguish between the two differential amplifiers, a single prime (') is attached to reference numerals of one differential amplifier.

The current measuring circuit of the second embodiment is arranged by interconnecting differential amplifiers 1a and 1a'. One end of the resistor $R_1$ of the differential amplifier 1a is connected with one end of the resistor $R_3'$ of the differential amplifier 1a', while one end of the resistor $R_3$ is connected with one end of the resistor $R_1'$. Further, the negative power-supply terminals 14 and 14' of the operational amplifiers 2 and 2' are connected with ground 3.

In the described arrangement, when the discharging current $I_1$ of the battery 10 flows through the resistor $R_A$, a very small potential difference $V_3$ is generated across the resistor $R_A$ and the voltage $V_3$ of the potential difference is applied between both the input terminals of the differential amplifiers 1a and 1a'. The voltage $V_3$ is amplified by the factor $R_2/R_1$ in the differential amplifier 1a and a positive voltage $V_{01}$ is output from the output terminal 12. At this time, the output voltage $V_{02}$ of the differential amplifier 1a' becomes 0 volt.

On the other hand, when the battery 10 is charged by the charger 21, the voltage $V_3$ of the potential difference due to the charging current $I_1$ is generated across the resistor $R_A$, and the voltage $V_3$ of the potential difference is applied between both the input terminals of the differential amplifiers 1a and 1a'. At this time, the output voltage $V_{01}$ of the differential amplifier 1a becomes 0 volt, while in the differential amplifier 1a', the voltage $V_3$ of the potential difference is amplified by the factor $R_2'/R_1'$ and this voltage is output from the output terminal 12' as a positive voltage $V_{02}$. Thus, according to the present embodiment, regardless of whether the current flows in the discharging direction or in charging direction, the output voltage can be measured as a positive voltage. Hence, it becomes unnecessary to distinguish between positive and negative voltages as in the above described first embodiment. Therefore, by measuring the positive voltage $V_{01}$ or $V_{02}$ with a measuring apparatus, the discharging current or charging current of the battery 10 can be measured. Since measurement of only positive voltage is made in the present embodiment, negative power supplies as the operating power supplies for the operational amplifiers 2 and 2' are not required. That is, the negative power-supply voltage can be 0 V. Therefore, the negative power-supply terminals 14 and 14' of the operational amplifiers 2 and 2' can be connected to ground 3 as described above. Thus, the negative power supply can be eliminated and, hence, the power supply circuit can be simplified.

Figure 3:
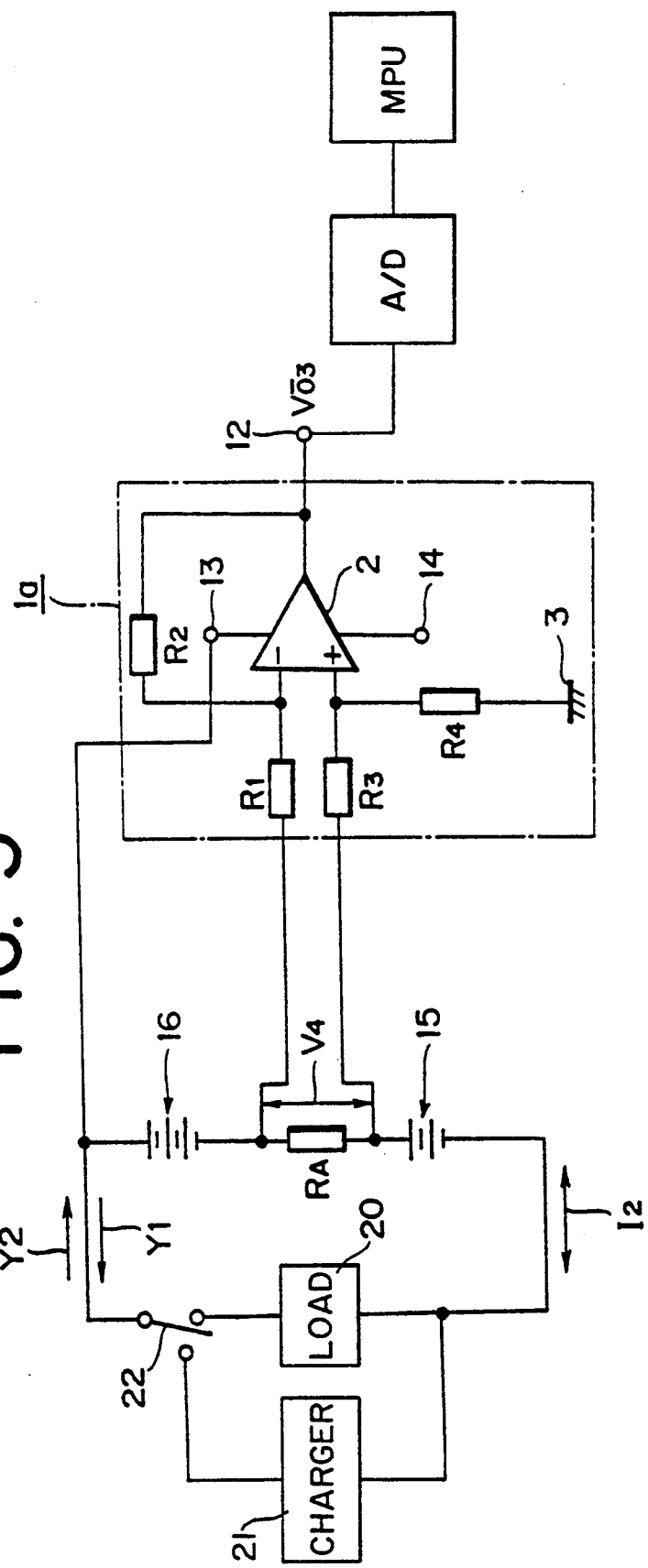
FIG. 3 is a circuit diagram of a current measuring circuit for measuring battery discharging/charging current according to a third embodiment of the present invention.

Referring to FIG. 3, there is shown a current measuring circuit of a third embodiment of the present invention. In this third embodiment, the battery 10 in the first and second embodiments is divided into two batteries 15 and 16 and the resistor $R_A$ is connected between the batteries 15 and 16 in series with them. The positive power-supply terminal 13 is connected with the positive side of the battery 16.

As a current $I_2$ flowing out of or into the batteries 15 and 16 flows through the resistor $R_A$, a very small potential difference $V_4$ is generated across the resistor $R_A$. The potential difference $V_4$ is amplified by the differential amplifier 1a to be output therefrom as a positive or negative voltage $V_{03}$. As mentioned herein-above, the positive power-supply voltage as the operating power supply for the operational amplifier 2 is only required to be a voltage higher than the sum of the voltage of the battery 15 and the voltage of the potential difference $V_4$. Therefore, as shown in FIG. 3, the positive power-supply terminal 13 can be connected to the positive side of the battery 16 to thereby utilize the battery voltage. Thus, in the present embodiment, a separate positive power supply can be eliminated and, hence, the power supply circuit can be simplified.

Figure 4:
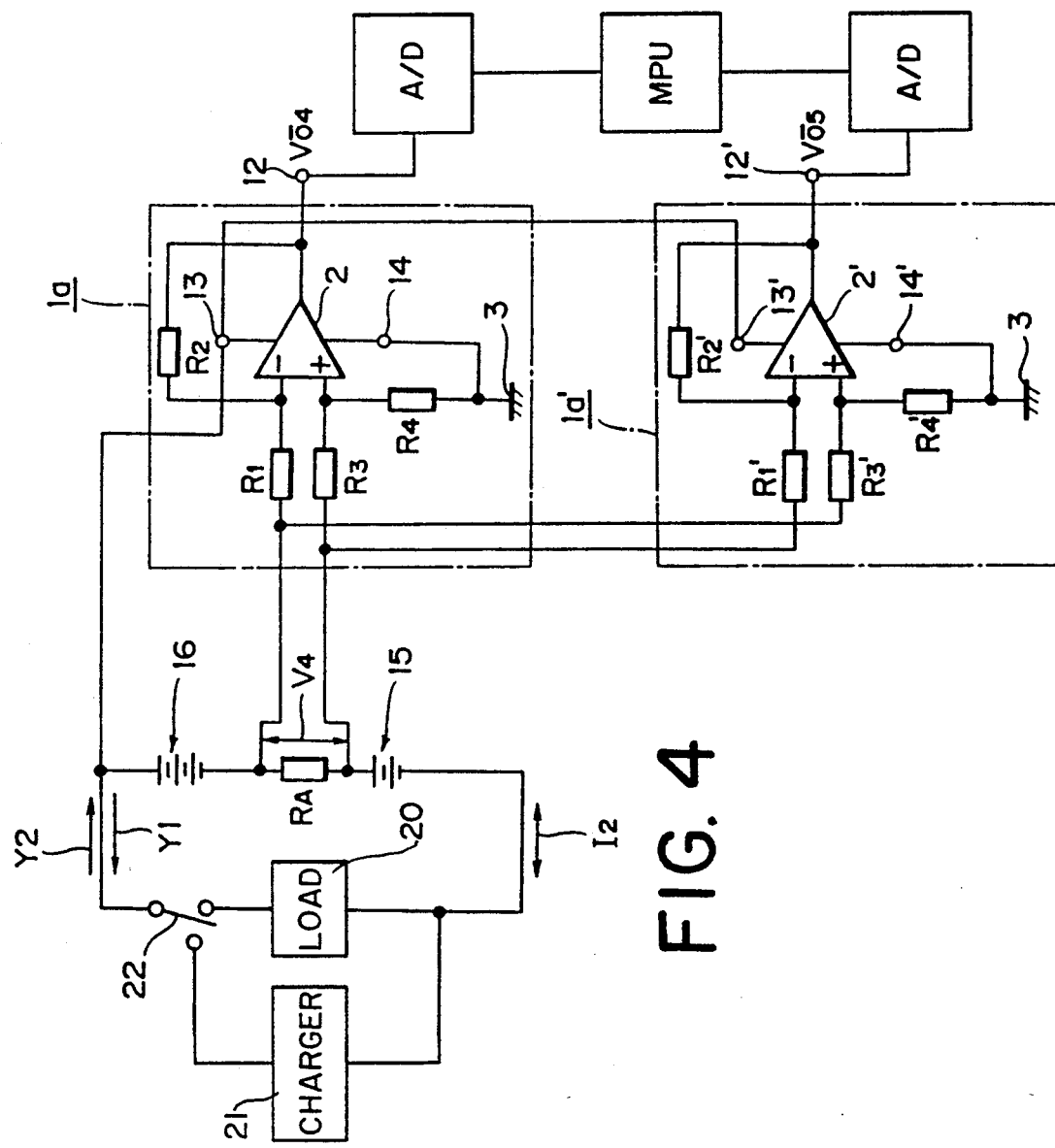
FIG. 4 is a circuit diagram of a current measuring circuit for measuring battery discharging/charging current according to a fourth embodiment of the present invention.

Referring to FIG. 4, there is shown a current measuring circuit of a fourth embodiment of the present invention. The current measuring circuit of this embodiment is arranged by adding a differential amplifier 1a' to the current measuring circuit shown in FIG. 3. More specifically, one end of a resistor $R_3'$ of the differential amplifier 1a' is connected to one end of the resistor $R_1$ of the differential amplifier 1a and one end of a resistor $R_1'$ is connected to one end of the resistor $R_3$, and a positive power-supply terminal 13' of an operational amplifier 2' is connected to the positive side of the battery 16 the same as the positive power-supply terminal 13 of the operational amplifier 2.

The operation of the current measuring circuit of the present embodiment is the same as in the second embodiment shown in FIG. 2. A positive output voltage $V_{04}$ is output from the output terminal 12 of the differential amplifier 1a when a discharging current flows out of the batteries 15 and 16, while a positive output voltage $V_{05}$ is output from the output terminal 12' of the differential amplifier 1a' when the batteries 15 and 16 are charged by the charger 21.

Therefore, the current flowing in either the discharging direction or the charging direction can be measured as a positive voltage. Thus, the negative power-supply voltages for the operational amplifiers 2 and 2' can be 0 V and, hence, the negative power-supply terminals 14 and 14' can be connected to ground to eliminate the negative power supply. Further, since voltages of the batteries 15 and 16 can be utilized as the positive power supplies for the operational amplifiers 2 and 2', no positive and negative power-supply apparatuses are required to be additionally provided for driving the operational amplifiers 2 and 2'.

Figure 5:
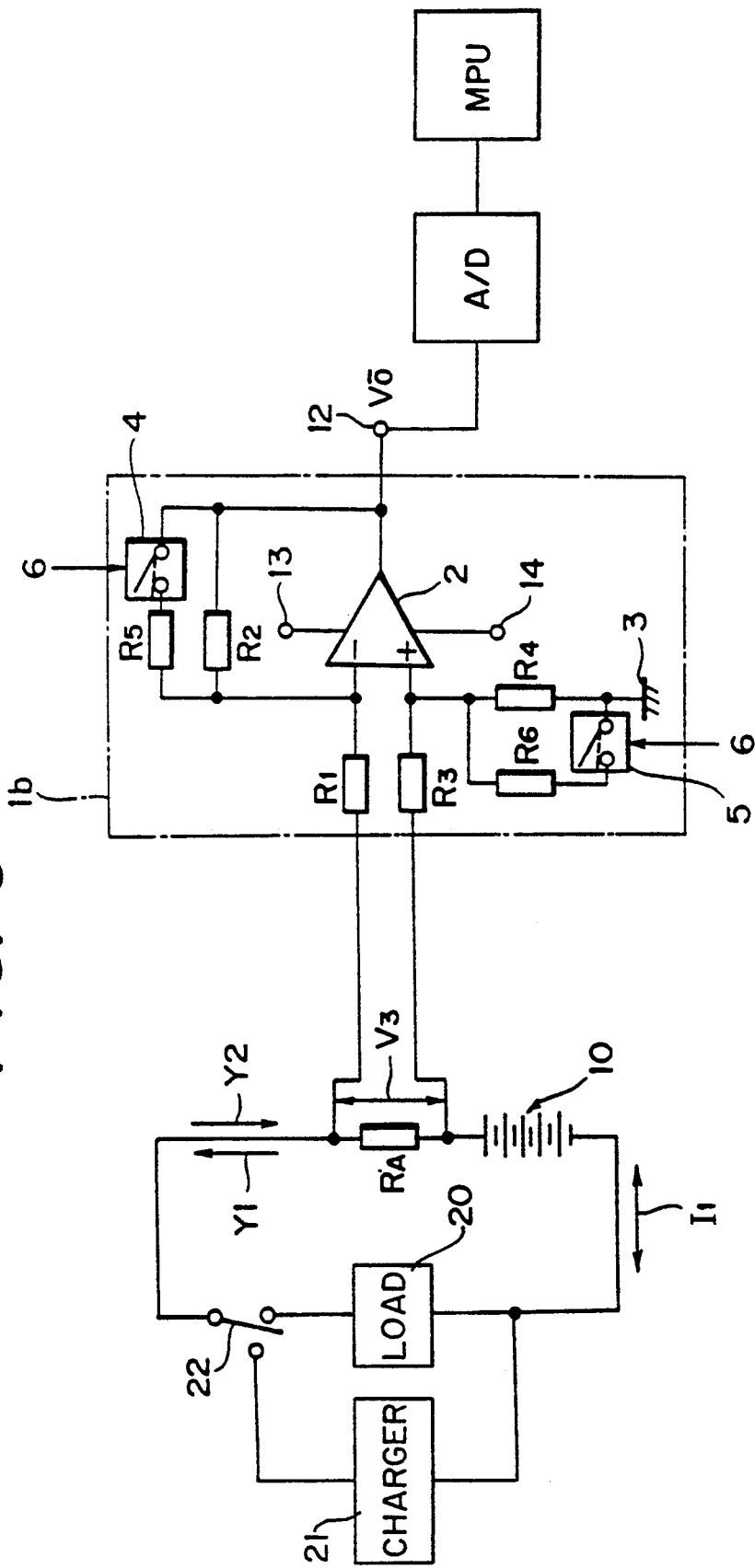
FIG. 5 is a circuit diagram of a current measuring circuit for measuring battery discharging/charging current according to a fifth embodiment of the present invention.

Referring to FIG. 5, there is shown a current measuring circuit of a fifth embodiment of the present invention. The differential amplifier 1b in this embodiment is arranged by adding a fifth resistor $R_5$ and a sixth resistor $R_6$ to the differential amplifier 1a shown in FIG. 1. More specifically, the fifth resistor $R_5$ is connected in parallel with the second resistor $R_2$ through a first switch 4, and the sixth resistor $R_6$ is connected in parallel with the fourth resistor $R_4$ through a second switch 5. Further, the first and second switches 4 and 5 are adapted to be turned on/off responding to a first control signal 6 output from a control means. When the first and second switches 4 and 5 are turned on responding to the first control signal 6 as indicated by the respective broken lines, the resistance value determining the gain of the operational amplifier 2 becomes $\{R_2 \cdot R_5/(R_2+R_5)\}/R_1$, which is smaller than the resistance value determining the gain $R_2/R_1$ in the previous state. Thus, the gain of the operational amplifier 2 can be decreased and, hence, the amplification factor of the differential amplifier 1b can be made smaller.

Accordingly, even when the current flowing through the resistor $R_4$ is a large current, it becomes possible, by turning on the first and second switches 4 and 5, to output the potential difference generated across the resistor $R_4$ after amplifying the same by a smaller amplification factor adjusted according to the magnitude of the large current. Thus, it becomes possible to bring the output voltage $V_0$ of the differential amplifier 1b to such a suitable voltage value as can be measured by a measuring means. That is, according to the present embodiment, currents widely ranging from a large current to a small current can be measured by switching the first and second switches.

Figure 6:
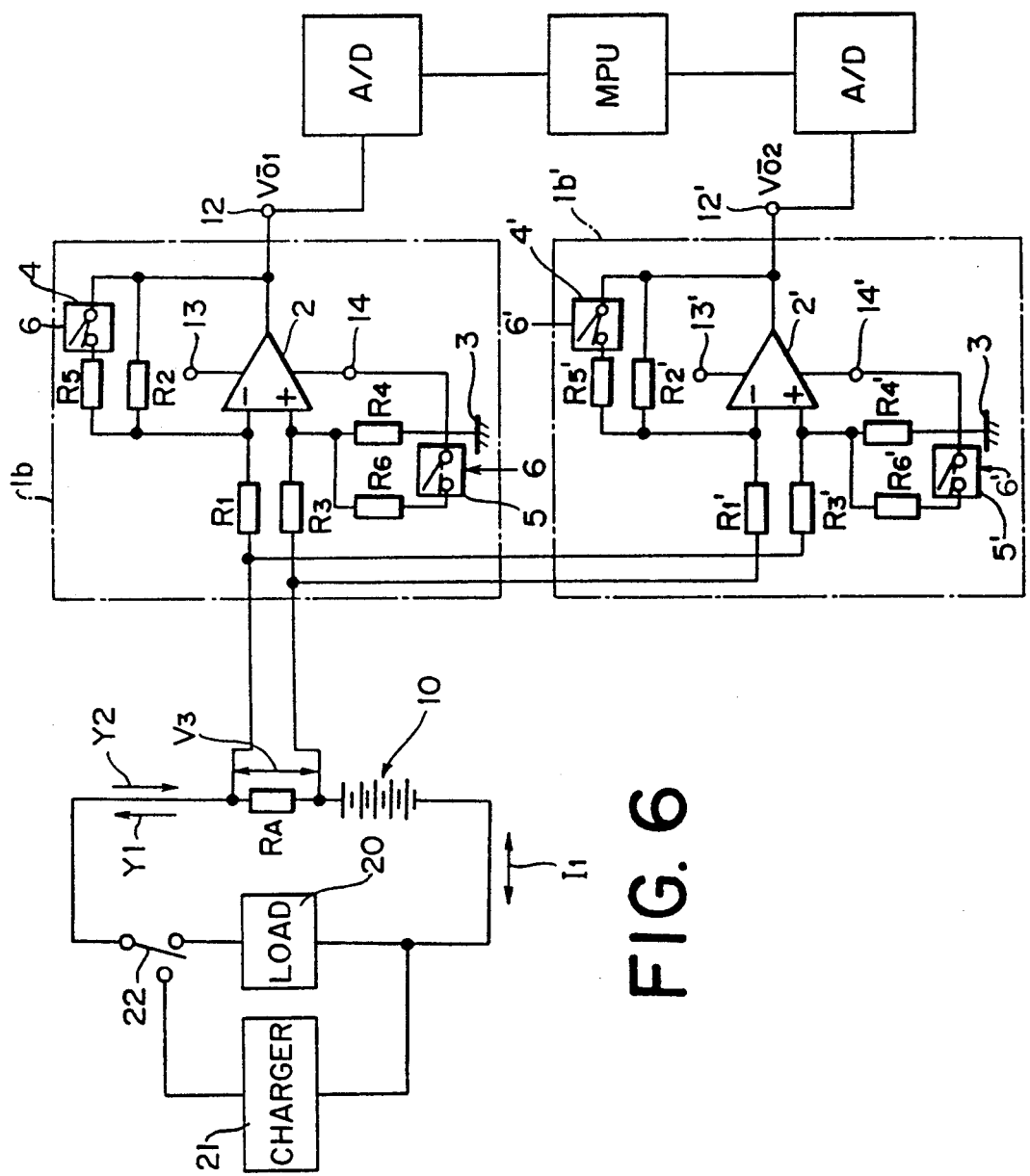
FIG. 6 is a circuit diagram of a current measuring circuit for measuring battery discharging/charging current according to a sixth embodiment of the present invention.
Figure 7:
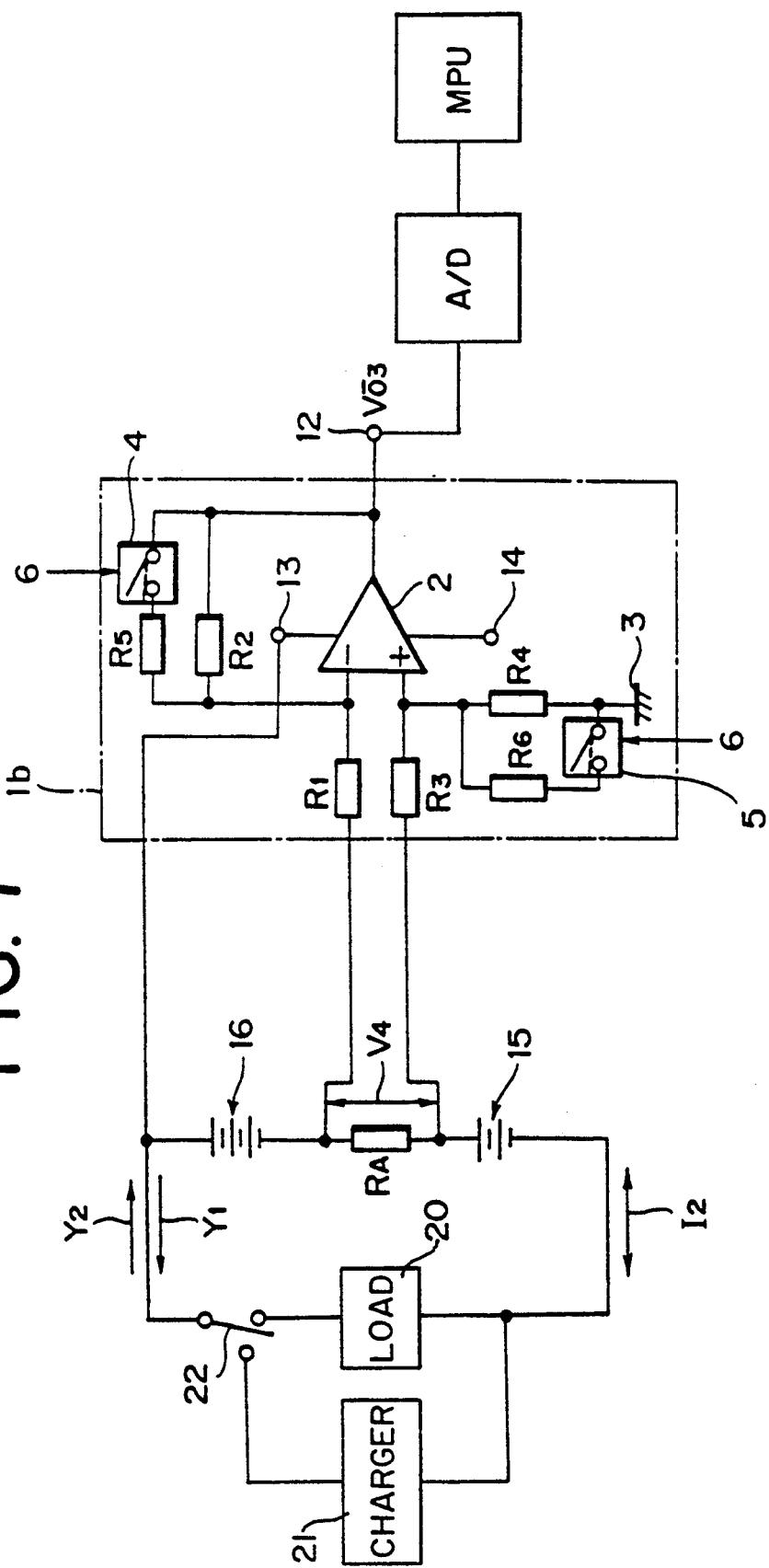
FIG. 7 is a circuit diagram of a current measuring circuit for measuring battery discharging/charging current according to a seventh embodiment of the present invention.
Figure 8:
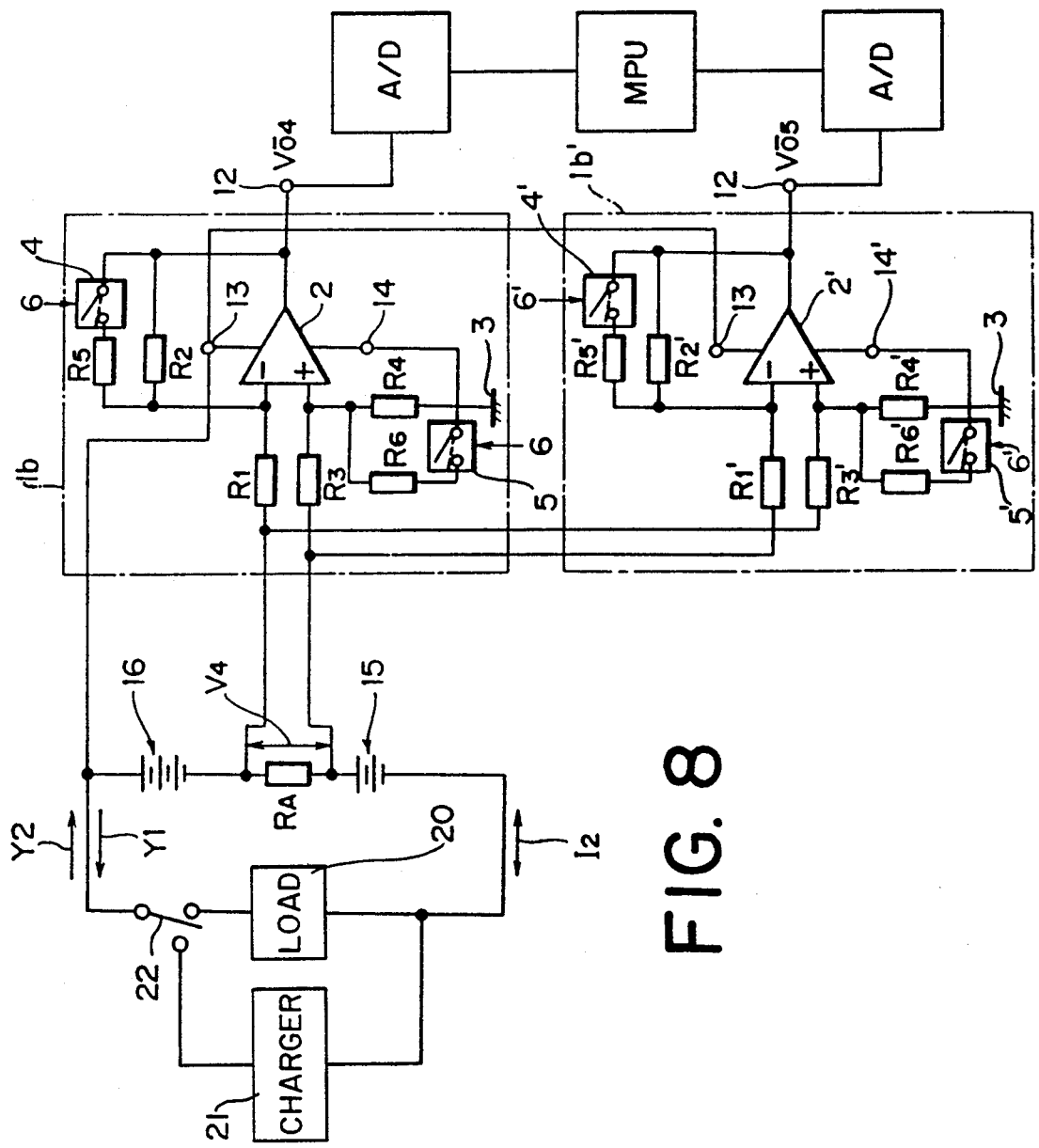
FIG. 8 is a circuit diagram of a current measuring circuit for measuring battery discharging/charging current according to an eighth embodiment of the present invention.

The above described advantage of measuring a wide range of current can be equally obtained by a sixth embodiment, a seventh embodiment and an eighth embodiment shown in FIGS. 6, 7 and 8, respectively. The sixth embodiment shown in FIG. 6 is improved, in comparison with the second embodiment shown in FIG. 2, because the sixth embodiment substitutes differential amplifiers 1b and 1b' in place of the differential amplifiers 1a and 1a' in the second embodiment. The seventh embodiment shown in FIG. 7 is improved, in comparison with the third embodiment shown in FIG. 3, because the seventh embodiment substitutes a differential amplifier 1b in place of the differential amplifier 1a in the third embodiment. Further, the eight embodiment shown in FIG. 8 is improved, in comparison with the fourth embodiment shown in FIG. 4, because the eighth embodiment substitutes differential amplifiers 1b and 1b' in place of the differential amplifiers 1a and 1a' in the fourth embodiment.

Since the sixth to eighth embodiments can easily change the amplification factors of the differential amplifiers, they can make measurements of a wide range of currents. Operations and other advantages of the sixth to eighth embodiments are equal to those of the second to fourth embodiments shown in FIGS. 2 to 4, respectively.

Figure 9:
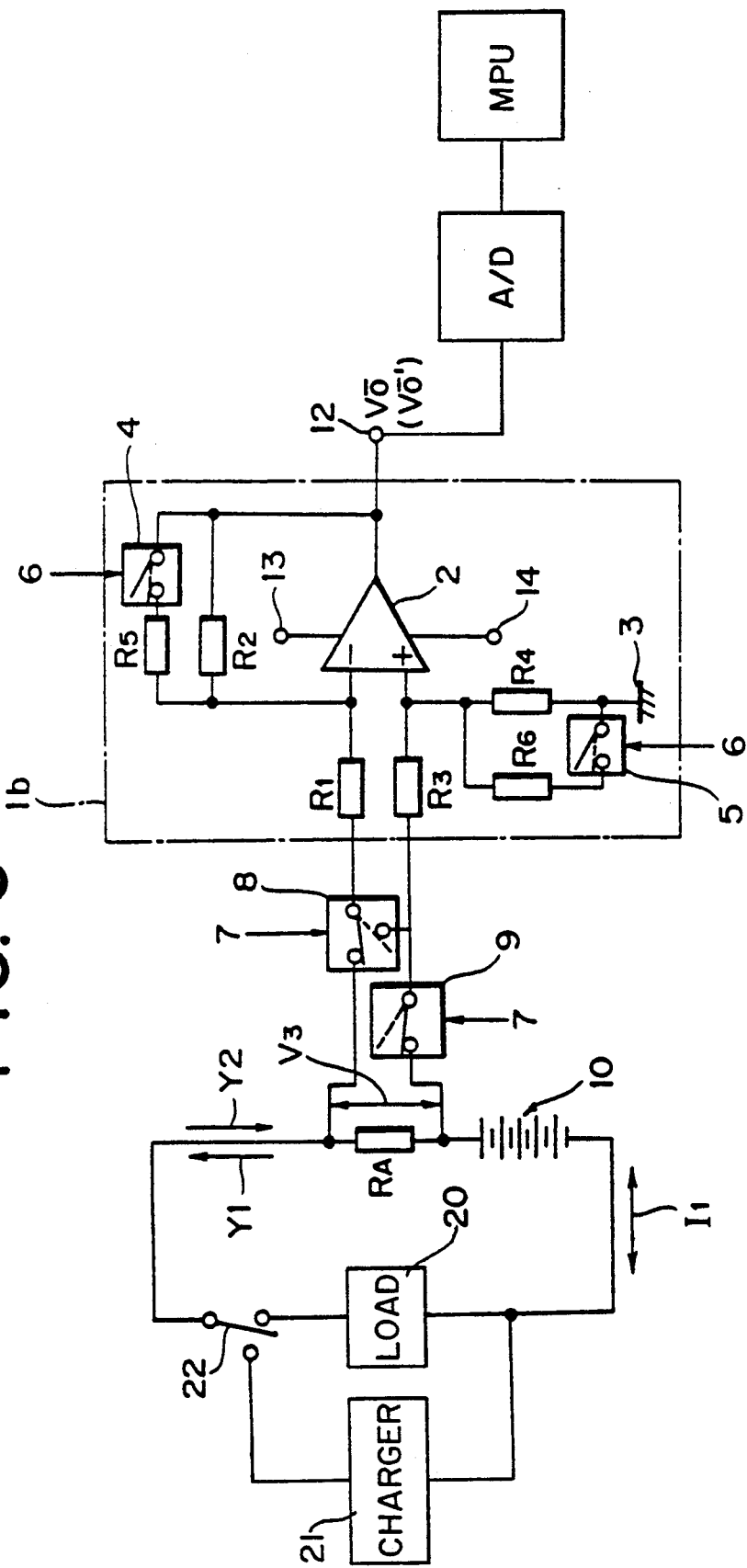
FIG. 9 is a circuit diagram of a current measuring circuit for measuring battery discharging/charging current according to a ninth embodiment of the present invention.

Referring now to FIG. 9, a current measuring circuit of a ninth embodiment of the present invention will be described. The current measuring circuit of this embodiment is arranged by using a third switch 8 and a fourth switch 9 in addition to the components making up the fifth embodiment.

More specifically, there is provided the third switch 8 which, responding to a second control signal 7, either connects one input terminal of the differential amplifier 1b (one end of the first resistor $R_1$ in FIG. 9) and one end of the resistor $R_4$ or isolates that input terminal of the differential amplifier 1b and that end of the resistor $R_4$ and, in addition, short-circuits that input terminal and the other input terminal of the differential amplifier 1b (one end of the third resistor $R_3$ in FIG. 9). Further, there is provided the fourth switch 9, which similarly responding to the second control signal 7, either connects the other input terminal of the differential amplifier 1b and the other end of the resistor $R_4$ or isolates them.

With the third and fourth switches 8 and 9 provided as described above, if both the input terminals of the operational amplifier 2 are short-circuited, an offset/drift voltage $V_0'$ is output from the operational amplifier 2. By correcting the voltage $V_0$ output from the differential amplifier 1b using the offset/drift voltage $V_0'$, the discharging and charging current measurements of the battery 10 can be performed more accurately.

At the time of the measurement, the third switch 8 and the fourth switch 9 are switched to the sides indicated by the broken lines. Thereby, the resistor $R_4$ is isolated from the resistor $R_1$ and the inverting input terminal (−) and the non-inverting input terminal (+) are short-circuited through the resistors $R_1$ and $R_3$ and, hence, the potential difference between both the input terminals becomes zero. The offset/drift voltage $V_0'$ output from the operational amplifier 2 when both its input terminals are short-circuited is measured by and stored in a processing unit through an A/D converter circuit.

Then, the third and fourth switches 8 and 9 are switched to the sides indicated by the solid lines and the output voltage $V_0$ of the operational amplifier 2 at this time is measured by the processing unit through the A/D converter circuit, and the difference between the thus measured voltage $V_0$ and the earlier stored voltage $V_0'$ is obtained. This difference provides a proper current value after correction.

By correcting the output voltage of the operational amplifier at the time of current measurement using the offset/drift voltage, a highly accurate current measuring circuit can be provided economically, without using an expensive operational amplifier of a low offset/low drift voltage type. Further, an advantage is obtained in that power consumption in the current measuring circuit can be reduced by turning off the fourth switch 9 thereby isolating the other input terminal of the differential amplifier 1b from the other end of the resistor $R_4$ and cutting off the useless current flowing through the resistors $R_3$ and $R_4$ when the current measurement is not performed.

Figure 10:
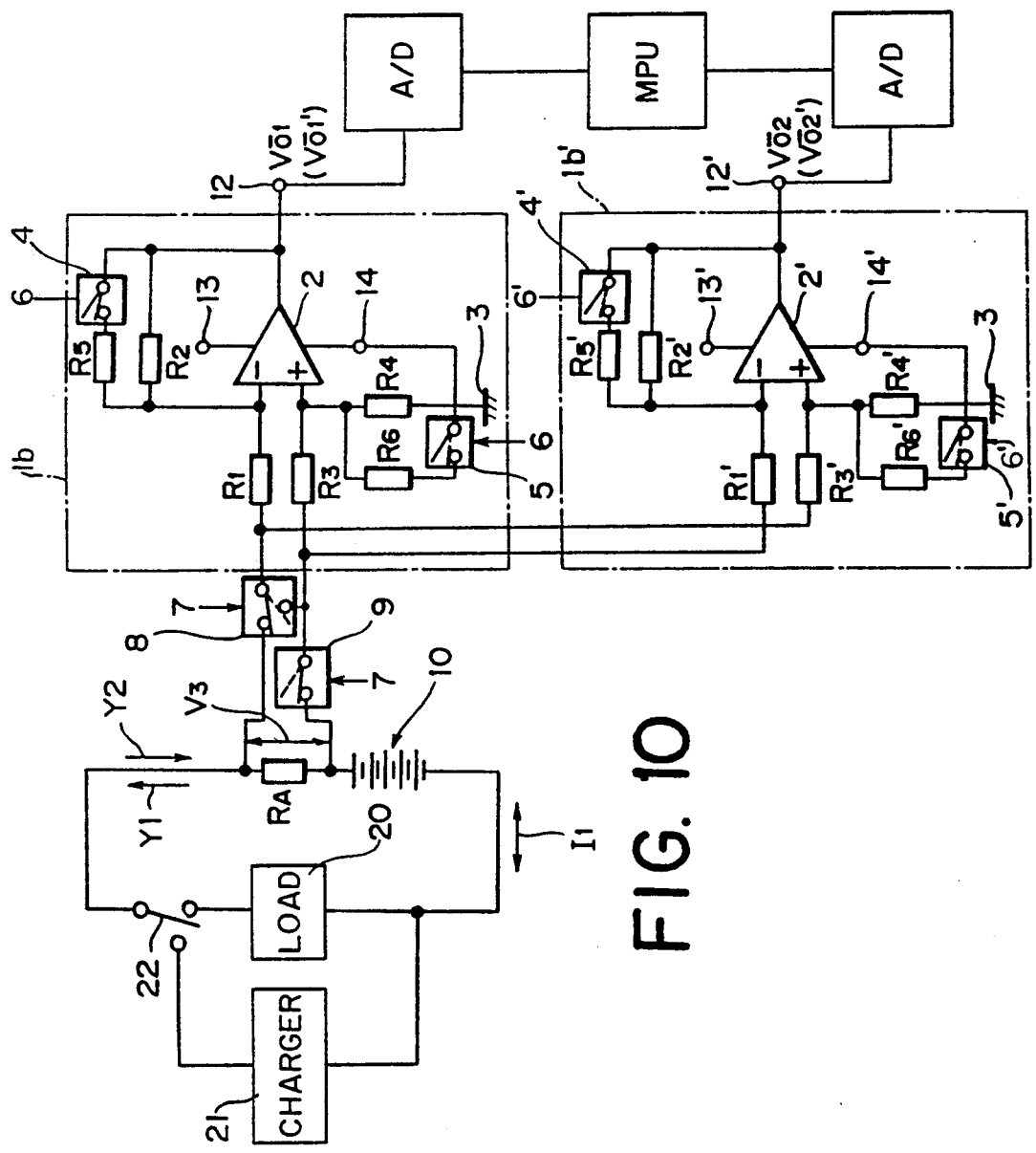
FIG. 10 is a circuit diagram of a current measuring circuit for measuring battery discharging/charging current according to a tenth embodiment of the present invention.
Figure 11:
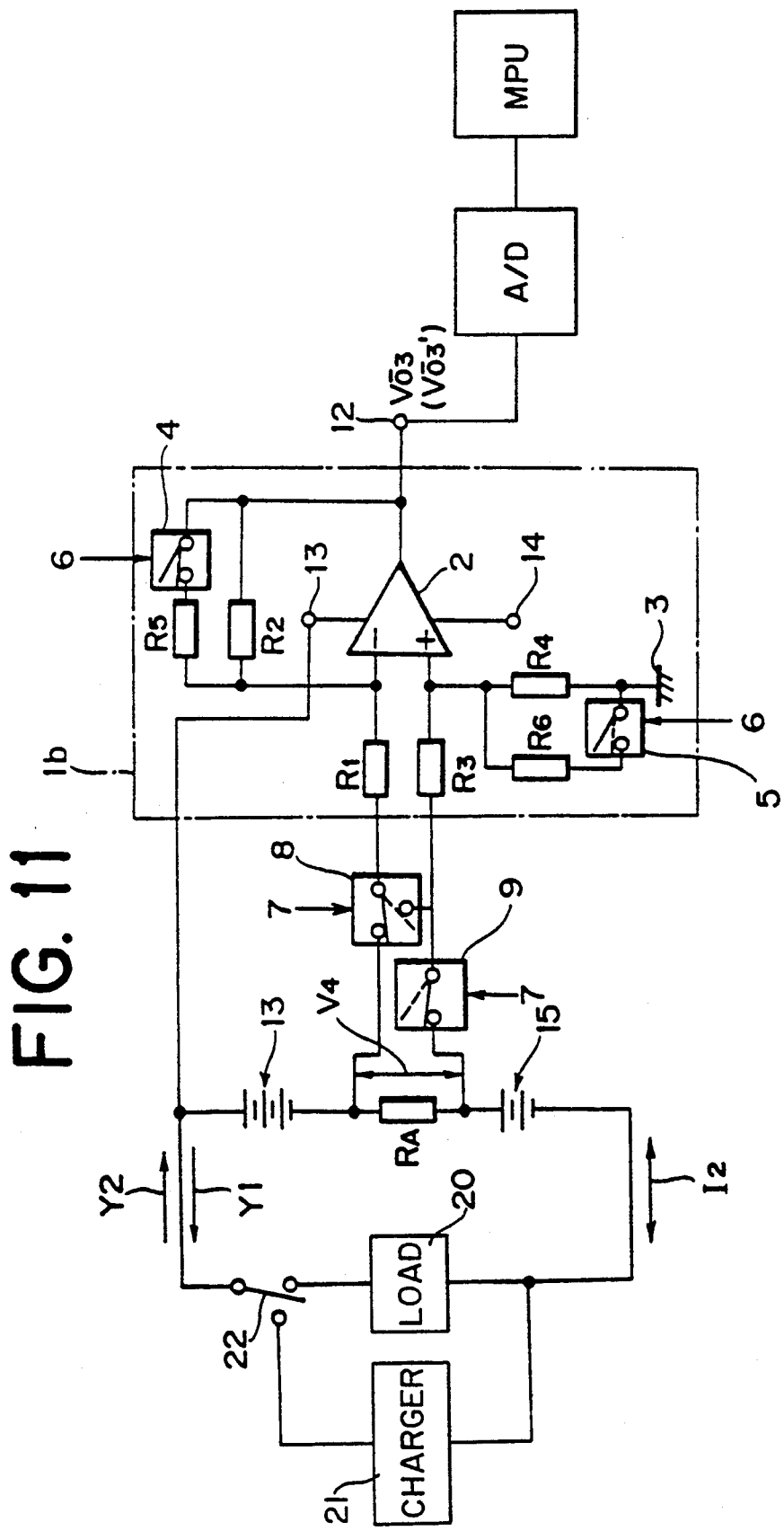
FIG. 11 is a circuit diagram of a current measuring circuit for measuring battery discharging/charging current according to an eleventh embodiment of the present invention.
Figure 12:
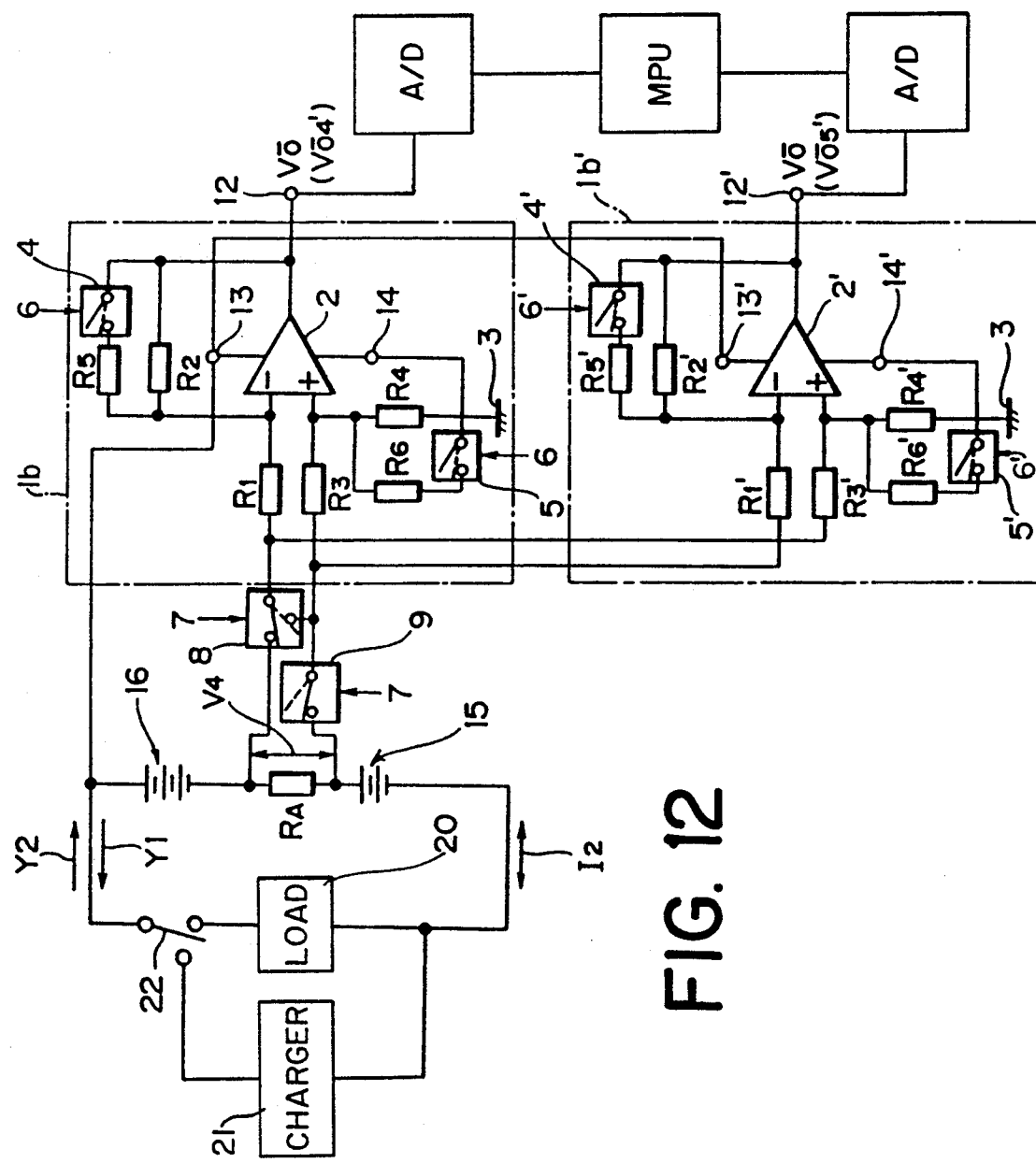
FIG. 12 is a circuit diagram of a current measuring circuit for measuring battery discharging/charging current according to a twelfth embodiment of the present invention.

The above described two advantages obtained in the ninth embodiment are similarly obtained by a tenth to a twelfth embodiment shown in FIGS. 10–12. The tenth embodiment shown in FIG. 10 has the arrangement of the sixth embodiment shown in FIG. 6 with a third switch 8 and a fourth switch 9 added thereto. In the tenth embodiment, the third switch 8 and the fourth switch 9 are switched responding to a second control signal 7 to the side indicated by the broken lines, and an offset/drift voltage $V_{01}'$ or $V_{02}'$ then output from the differential amplifier 1b or 1b' is measured by and stored in a processing unit through an A/D converter circuit. Then, the third and fourth switches 8 and 9 are switched to the side indicated by the solid lines. The output voltage $V_{01}$ or $V_{02}$ at this time is measured by the processing unit through the A/D converter circuit and the difference between the thus measured voltage $V_{01}$ or $V_{02}$ and the earlier stored voltage $V_{01}'$ or $V_{02}'$ is obtained.

Thus, highly accurate measurement of the discharging current or charging current of the battery 10 can be achieved and, further, power consumption in the current measuring circuit when no current is measured can be reduced by turning off the fourth switch 9.

FIG. 11 shows the eleventh embodiment of the present invention. This embodiment has the arrangement of the seventh embodiment shown in FIG. 7 with a third switch 8 and a fourth switch 9 added thereto. Also in this embodiment, an offset/drift voltage $V_{03}'$ is similarly measured and stored. Then, the output voltage $V_{03}$ of the differential amplifier 1b is measured and the difference between this measured voltage $V_{03}$ and the earlier stored voltage $V_{03}'$ is obtained. Thereby, highly accurate measurement of the discharging current or charging current can be achieved. Further, by turning off the fourth switch 9 when the current $I_2$ is not measured, power consumption in the current measuring circuit can be reduced.

FIG. 12 shows the twelfth embodiment of the present invention. This embodiment has the arrangement of the eighth embodiment shown in FIG. 8 with a third switch 8 and a fourth switch 9 added thereto. Also in this embodiment, an offset/drift voltage $V_{04}'$ is $V_{05}'$ is similarly measured and stored. Then output voltage $V_{04}$ or $V_{05}$ of the differential amplifier 1b or 1b' is measured and the difference between this measured output voltage $V_{04}$ or $V_{05}$ and the earlier stored voltage $V_{04}'$ or $V_{05}'$ is obtained. Thereby, highly accurate measurement of the discharging current or charging current can be achieved. Further, power consumption in the current measuring circuit when no current is measured can be reduced by turning off the fourth switch 9.

We claim:

1. A current measuring circuit for measuring discharging current and charging current of a battery comprising:
    a first battery adapted to be selectively connected to a load and a charger;
    a resistor connected in series with the first battery having a sufficiently low resistance value as not to substantially restrain an output current from the first battery;
    a first differential amplifier, which amplifies a potential difference across the resistor, the first differential amplifier comprising
    a first operational amplifier,
    a first resistor connected between one end of the resistor and one input terminal of the first operational amplifier,
    a second resistor connected between the on input terminal and the output terminal of the first operational amplifier,
    a third resistor connected between the other end of the resistor and the other input terminal of the first operational amplifier, and
    a fourth resistor connected between the other input terminal of the first operational amplifier and ground, the resistance value of the first resistor being equal to the resistance value of the third resistor and the resistance value of the second resistor being equal to the resistance value of the fourth resistor;
    means for short-circuiting the one input terminal and the other input terminal of the first operational amplifier; and
    calculating means for calculating difference between a first voltage outputted by the first operational amplifier when the one input terminal and the other input terminal of the first operational amplifier are short-circuited and a second voltage outputted by the first operational amplifier when the one input terminal of the first operational amplifier is connected with the one end of the resistor and the other input terminal of the first operational amplifier is connected with the other end of the resistor .

2. The current measuring circuit according to claim 1, further comprising a second differential amplifier, which amplifies the potential difference across the resistor, the second differential amplifier comprising:
    a second operational amplifier;
    a seventh resistor connected between the other end of the resistor and one input terminal of the second operational amplifier;
    an eighth resistor connected between the one input terminal and the output terminal of the second operational amplifier;
    a ninth resistor connected between the one end of the resistor and the other input terminal of the second operational amplifier; and
    a tenth resistor connected between the other input terminal of the second operational amplifier and ground, the resistance value of the seventh resistor being equal to the resistance value of the ninth resistor and the resistance value of the eighth resistor being equal to the resistance value of the tenth resistor.

3. The current measuring circuit according to claim 1, further comprising a second battery connected in series with the resistor at the one end of the resistor, wherein the positive power-supply terminal of the first operational amplifier is connected with the positive voltage output terminal of the second battery.

4. The current measuring circuit according to claim 1, further comprising a second battery connected in series with the resistor at the one end of the resistor, wherein the positive power-supply terminals of the first operational amplifier and the second operational amplifier are connected with the positive voltage output terminal of the second battery and the negative power-supply terminals of the first operational amplifier and the second operational amplifier are grounded.

5. The current measuring circuit according to claim 1, wherein the resistance value of the resistor is below $0.1 \Omega$.

6. A current measuring circuit for measuring discharging current and charging current of a battery comprising:
    a first battery adapted to be selectively connected to a load and a charger;
    a resistor connected in series with the first battery having a sufficiently low resistance value as not to substantially restrain an output current from the first battery; and
    a first differential amplifier, which amplifies a potential difference across the resistor, the first differential amplifier comprising:
    a first operational amplifier,
    a first resistor connected between one end of the resistor and one input terminal of the first operational amplifier,
    a second resistor connected between the one input terminal and the output terminal of the first operational amplifier,
    a third resistor connected between the other end of the resistor and the other input terminal of the first operational amplifier,
    a fourth resistor connected between the other input terminal of the first operational amplifier and ground, the resistance value of the first resistor being equal to the resistance value of the third resistor and the resistance value of the second resistor being equal to the resistance value of the fourth resistor, a fifth resistor connected in parallel with the second resistor, a first switch connected in series with the fifth resistor and in parallel with the second resistor, a sixth resistor connected in parallel with the fourth resistor, and a second switch connected in series with the sixth resistor and in parallel with the fourth resistor.

7. A current measuring circuit for measuring discharging current of a battery comprising:

a battery connected to a load;

a resistor connected in series with the battery having a sufficiently low resistance value as not to substantially restrain output current from the battery;

a differential amplifier, which amplifies a potential difference across the resistor, the differential amplifier comprising:

an operational amplifier, a first resistor connected between one end of the resistor and one input terminal of the first operational amplifier, a second resistor connected between the one input terminal and the output terminal of the operational amplifier, a third resistor connected between the other end of the resistor and the other input terminal of the operational amplifier, and a fourth resistor connected between the other input terminal of the operational amplifier and ground, the resistance value of the first resistor being equal to the resistance value of the third resistor and the resistance value of the second resistor being equal to the resistance value of the fourth resistor;

means for short-circuiting the one input terminal and the other input terminal of the operational amplifier; and calculating means for calculating differential between a first voltage outputted by the operational amplifier when the one input terminal and the other input terminal of the operational amplifier are short-circuited and a second voltage outputted by the operational amplifier when the one input terminal of the operational amplifier is connected with the one end of said resistor and the other input terminal of the operational amplifier is connected with the other end of the resistor.

8. A current measuring circuit for measuring discharging current of a battery comprising:

a battery connected to a load; a resistor connected in series with the battery having a sufficiently low resistance value as not to substantially restrain output current from the battery; and a differential amplifier, which amplifies a pontential difference across the resistor, the differential amplifier comprising:

an operational amplifier, a first resistor connected between one end of the resistor and one input terminal of the operational amplifier, a second resitor connected between the one input terminal and the output terminal of the operational amplifier, a third resistor connected between the other end of the resistor and the other input terminal of the operational amplifier, a fourth resistor connected between the other input terminal of the operational amplifier and ground, the resistance value of the first resistor being equal to the resistance value of the third resistor and the resistance value of the second resistor being equal to the resistance value of the fourth resistor, a fifth resistor connected in parallel with the second resistor, a first switch connected in series with the fifth resistor and in parallel with the second resistor, a sixth resistor connected in parallel with the fourth resistor, and a second switch connected in series with the sixth resistor and in parallel with the fourth resistor.

9. A current measuring circuit for measuring discharging current and charging current of a battery, comprising:

a first battery adapted to be selectively connected to a load and a charge, wherein the first battery supplies an output current when connected to the load and receives current when connected to the charger;

a resistor connected in series with the first battery having a sufficiently low resistance value so that the output current from the first battery is not substantially restrained;

a differential amplifier, which amplifies a potential difference across the resistor, the differential amplifier comprising:

an operational amplifier having a first input terminal, a second input terminal and an output terminal, a first resistor connected between one end of the resistor and the first input terminal of the operational amplifier, a second resistor connected between the first input terminal and the output terminal of the operational amplifier, a third resistor connected between other end of the resistor and the second input terminal of the operational amplifier, the third resistor having a resistance value equal to resistance value of the first resistor, a fourth resistor connected between the second input terminal of the operational amplifier and ground, the fourth resistor having a resistance value equal to the resistance value of the second resistor, a fifth resistor connected in parallel with the second resistor, a first switch connected in series with the fifth resistor and in parallel with the second resistor, a sixth resistor connected in parallel with the fourth resistor, and a second switch connected in series with the sixth resistor and in parallel with the fourth resistor;

means for controlling the first and second switches to increase or decrease the amplification factor of the differential amplifier;

means for short-circuiting the first input terminal and the second input terminal of the operational amplifier, and calculating means for calculating difference between a first voltage outputted by the operational amplifier when the first input terminal and the second input terminal of the operational amplifier are not short circuited and a second voltage outputted by the operational amplifier when the first input terminal of the operational amplifier is connected with the one end of the resistor and the second input terminal of the operational amplifier is connected with the other end of the resistor.

10. The current measuring circuit according to claim 9, further comprising a second battery connected in series with the resistor at the one end of the resistor, wherein the positive power-supply terminal of the first operational amplifier is connected with the positive voltage output terminal of the second battery and the negative power-supply terminal of the first operational amplifier is grounded.

11. The current measuring circuit according to claim 9, wherein the resistance value of the resistor is below $0.1\Omega$.

12. A current measuring circuit for measuring discharging current and charging current of a battery comprising:
- a first battery adapted to be selectively connected to a load and a charger, wherein the first battery supplies an output current when connected to the load and receives current when connected to the charger;
- a resistor connected in series with the first battery having a sufficiently low resistance value so that the output current of the first battery is not substantially restrained;
- a first differential amplifier, which amplifies a potential difference across the resistor, the first differential amplifier comprising:
  - a first operational amplifier having a first terminal, a second terminal and an output terminal,
  - a first resistor connected between one end of the resistor and the first input terminal of the first operational amplifier,
  - a second resistor connected between the first input terminal and the output terminal of the first operational amplifier,
  - a third resistor connected between the other end of the resistor and the second input terminal of the first operational amplifier, the third resistor having a resistance value equal to resistance value of the first transistor,
  - a fourth resistor connected between the second input terminal of the first operational amplifier and ground, the fourth resistor having a resistance value equal to the resistance value of the second resistor,
  - a fifth resistor connected in parallel with the second resistor,
  - a first switch connected in series with the fifth resistor and in parallel with the second resistor,
  - a sixth resistor connected in parallel with the fourth resistor, and
  - a second switch connected in series with the sixth resistor and in parallel with the fourth resistor;
- a second operational amplifier, which amplifies the potential difference across the resistor, the second differential amplifier comprising:
  - a second operational amplifier,
  - a seventh resistor connected between the other end of the resistor and one input terminal of the second operational amplifier,
  - an eighth resistor connected between the one input terminal and output terminal of the second operational amplifier,
  - a ninth resistor connected between the one end of the resistor and the other input terminal of the second operational amplifier, a ninth resistor having a resistance value equal to resistance value of the seventh resistor,
  - a tenth resistor connected between the other input terminal of the second operational amplifier and ground, the tenth resistor having a resistance value equal to resistance value of the eighth resistor,
  - an eleventh resistor connected in parallel with the eighth resistor,
  - a third switch connected in series with the eleventh resistor and in parallel with the eleventh resistor,
  - a twelfth resistor connected in parallel with the tenth resistor, and
  - a fourth switch connected in series with the twelfth resistor and in parallel with the tenth resistor;
- means for short-circuiting the first input terminal and the second input terminal of the first operational amplifier, and for short-circuiting the one input terminal and the other input terminal of the second operation amplifier;
- means for controlling the first and second switches to decrease or increase amplification factor of the first differential amplifier and for controlling the third and fourth switches to increase or decrease the amplification factor of the second differential amplifier;
- calculating means for calculating difference between a first voltage outputted by the first operational amplifier when the first input terminal and the second input terminal of the first operational amplifier are short-circuited and a second voltage outputted from the first operational amplifier when the first input terminal of the first operational amplifier is connected with the one end of the resistor and the second input terminal of the first operational amplifier is connected with the other end of the resistor; and
- calculating means for calculating difference between a third voltage outputted by the second operational amplifier when the one input terminal and the other input terminal of the second operational amplifier are short-circuited and a fourth voltage outputted from the second operational amplifier when the other input terminal of the second operational amplifier is connected with the one end of the resistor and the one input terminal of the second operational amplifier is connected with the other end of the resistor.

13. The current measuring circuit according to claim 12, further comprising a second battery connected in series with the resistor at the one end of the resistor, wherein the positive power-supply terminals of the first operational amplifier and the second operational amplifier are connected with the positive voltage output terminal of the second battery and the negative power-supply terminals of the first operational amplifier and the second operational amplifier are grounded.

14. The current measuring circuit according to claim 12, wherein the resistance value of the resistor is below $0.1\ \Omega$.

* * * * *

UNITED STATES PATENT AND TRADEMARK OFFICE
CERTIFICATE OF CORRECTION

PATENT NO. : 5,254,951
DATED : October 19, 1993
INVENTOR(S) : Seijo GOTO et al.

It is certified that error appears in the above-indentified patent and that said Letters Patent is hereby corrected as shown below:

<u>On the Cover Page</u>, item

[54] change "CIRCUIT FOR MEASURING DISCHARGING AND CHARGING CURRENT OF A BATTERY PROVIDING OFFSET/DRIFT VOLTAGE FOR CORRECTING AMPLIFIER OUTPUT" TO --CIRCUIT FOR MEASURING DISCHARGING AND CHARGING CURRENT OF A BATTERY--.

Column 4, Line 24, Delete "$R_1 = {}_{R3}$" and insert --$R_1 = R_3$--.

Column 9, Line 38, Claim 1, insert --:-- after "comprising".
Line 44, Claim 1, change "on" to --one--.

Signed and Sealed this

Ninth Day of August, 1994

Attest:

BRUCE LEHMAN

*Attesting Officer*    *Commissioner of Patents and Trademarks*